US011720031B2

(12) United States Patent
Steely-Tarshish et al.

(10) Patent No.: US 11,720,031 B2
(45) Date of Patent: Aug. 8, 2023

(54) OVERLAY DESIGN FOR ELECTRON BEAM AND SCATTEROMETRY OVERLAY MEASUREMENTS

(71) Applicant: KLA Corporation, Milpitas, CA (US)

(72) Inventors: Inna Steely-Tarshish, Yokneam Ilit (IL); Stefan Eyring, Weilburg (DE); Mark Ghinovker, Yoqneam Ilit (IL); Yoel Feler, Haifa (IL); Eitan Hajaj, Ashqelon (IL); Ulrich Pohlmann, Jena (DE); Nadav Gutman, Zichron Ya'aqov (IL); Chris Steely, Yokneam Ilit (IL); Raviv Yohanan, Qiryat Motzkin (IL); Ira Naot, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/487,725

(22) Filed: Sep. 28, 2021

(65) Prior Publication Data

US 2022/0413394 A1 Dec. 29, 2022

Related U.S. Application Data

(60) Provisional application No. 63/215,551, filed on Jun. 28, 2021.

(51) Int. Cl.
G03F 7/00 (2006.01)
G01N 21/47 (2006.01)
G01N 21/95 (2006.01)
G03F 7/20 (2006.01)

(52) U.S. Cl.
CPC ..... G03F 7/70633 (2013.01); G01N 21/4785 (2013.01); G01N 21/4788 (2013.01); G01N 21/9501 (2013.01); G03F 7/70625 (2013.01)

(58) Field of Classification Search
CPC ............ G03F 7/70633; G03F 7/70625; G01N 21/4785; G01N 21/4788; G01N 21/9501
See application file for complete search history.

(56) References Cited

U.S. PATENT DOCUMENTS

| 6,985,618 | B2 | 1/2006 | Adel et al. |
| 7,193,699 | B2 | 3/2007 | Michelsson |
| 7,292,328 | B2 | 11/2007 | Kreh et al. |
| 7,417,719 | B2 | 8/2008 | Michelsson |
| 7,440,105 | B2 * | 10/2008 | Adel ....................... H01L 22/12 257/797 |

(Continued)

FOREIGN PATENT DOCUMENTS

DE 102005014595 A1 10/2006

OTHER PUBLICATIONS

WIPO, International Search Report for International Application No. PCT/US2022/033507, dated Oct. 5, 2022.

(Continued)

*Primary Examiner* — Hung V Nguyen
(74) *Attorney, Agent, or Firm* — Hodgson Russ LLP (57) ABSTRACT

Combined electron beam overlay and scatterometry overlay targets include first and second periodic structures with gratings. Gratings in the second periodic structure can be positioned under the gratings of the first periodic structure or can be positioned between the gratings of the first periodic structure. These overlay targets can be used in semiconductor manufacturing.

12 Claims, 10 Drawing Sheets

(56) References Cited

U.S. PATENT DOCUMENTS

| | | |
|---|---|---|
| 7,477,370 B2 | 1/2009 | Michelsson et al. |
| 7,657,077 B2 | 2/2010 | Michelsson et al. |
| 7,973,931 B2 | 7/2011 | Michelsson et al. |
| 8,200,003 B2 | 6/2012 | Michelsson |
| 8,200,004 B2 | 6/2012 | Michelsson et al. |
| 8,264,534 B2 | 9/2012 | Michelsson |
| 8,705,837 B2 | 4/2014 | Michelsson et al. |
| 10,002,806 B2 | 6/2018 | Amir et al. |
| 10,473,460 B2 | 11/2019 | Gutman et al. |
| 10,474,040 B2 | 11/2019 | Laske et al. |
| 10,705,435 B2 * | 7/2020 | Yang ............... G03F 9/7049 |
| 11,112,369 B2 | 9/2021 | Gready |
| 11,182,892 B2 | 11/2021 | Michelsson et al. |
| 2004/0165764 A1 | 8/2004 | Michelsson |
| 2005/0008217 A1 | 1/2005 | Luu et al. |
| 2005/0018190 A1 | 1/2005 | Sezginer et al. |
| 2006/0103838 A1 | 5/2006 | Richter et al. |
| 2006/0240580 A1 | 10/2006 | Michelsson |
| 2008/0062415 A1 | 3/2008 | Michelsson |
| 2008/0249728 A1 | 10/2008 | Michelsson et al. |
| 2013/0084655 A1 * | 4/2013 | Yue ............... G03F 7/70466 257/E21.527 |
| 2014/0362363 A1 | 12/2014 | Cai |
| 2014/0375984 A1 | 12/2014 | Choi et al. |
| 2015/0255296 A1 | 9/2015 | Iida et al. |
| 2016/0179017 A1 | 6/2016 | Yohanan et al. |
| 2019/0033726 A1 | 1/2019 | Adam et al. |
| 2021/0200106 A1 * | 7/2021 | Levinski ............ G03F 7/70633 |
| 2021/0240089 A1 | 8/2021 | Golotsvan et al. |

OTHER PUBLICATIONS

WIPO, Written Opinion of the International Searching Authority for International Application No. PCT/US2022/033507, dated Oct. 5, 2022.

\* cited by examiner

OVERLAY DESIGN FOR ELECTRON BEAM AND SCATTEROMETRY OVERLAY MEASUREMENTS

CROSS REFERENCE TO RELATED APPLICATIONS

This disclosure is based on, and claims priority to, U.S. Provisional Application No. 63/215,551, filed on Jun. 28, 2021, the entire disclosure of which is incorporated by reference herein.

FIELD OF THE DISCLOSURE

This disclosure relates to overlay measurements in semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

The relative position of structures within a semiconductor device is referred to as overlay (OVL). The measurement of overlay error between successive patterned layers on a wafer is a process control technique in integrated circuit manufacturing. Overlay accuracy generally pertains to the determination of how accurately a first patterned layer aligns with respect to a second patterned layer disposed above or below it and to the determination of how accurately a first pattern aligns with respect to a second pattern disposed on the same layer.

Metrology processes are used at various steps during a semiconductor manufacturing process to monitor and control one or more semiconductor layer processes. An overlay measurement generally specifies how accurately a first patterned layer aligns with respect to a second patterned layer disposed above or below it or how accurately a first pattern aligns with respect to a second pattern disposed on the same layer. Overlay error is one of the characteristics that is monitored and controlled. The overlay error is typically determined with an overlay target having structures formed on one or more layers of a workpiece (e.g., a semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

Overlay metrology targets are printed to measure registration between two or more layers. The structures on the wafer may take the form of gratings, and these gratings may be periodic. If the two layers or patterns are properly formed, then the structure on one layer or pattern may be aligned relative to the structure on the other layer or pattern.

Various technology and processes for measuring overlay have been developed and employed with varying degrees of success. Overlay metrology has become a technique that helps enable lithographic patterning. Overlay measurements are done by various algorithms, which extract the overlay term from the target's asymmetry. The overlay metrology target is designed in such a way so the overlay would induce an asymmetry signature in the reflected signal.

Current methods for optical overlay measurement rely on two main technologies: imaging and scatterometry. Scatterometry overlay measurement and imaging-based overlay measurement use different target designs due to their different measurement methods. In imaging, the position of periodic targets is measured in the field of view of the optical system and the overlay is deduced from positions of targets printed in different layers. Scatterometry utilizes interference between electromagnetic (EM) waves scattered by periodic overlay marks (targets with periodic structures) printed at different layers to deduce the relative displacement of the layers. In both cases a control on amplitudes and phases of the diffraction orders of the scattered electromagnetic waves may provide an effect on accuracy and precision of overlay measurement.

When overlay errors are observed, an overlay measurement may be used to apply corrections and to keep overlay errors within desired limits. For example, overlay measurements may be fed into an analysis routine that calculates scanner corrections, as well as other statistics, which may be used by an operator in order to better align the lithography tool used in the process. In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot.

However, improved target designs and methods of measurement are needed as semiconductor devices become more complex.

BRIEF SUMMARY OF THE DISCLOSURE

An embodiment of the present disclosure provides a target. The target may comprise a first periodic structure formed on a first layer of a semiconductor device. Each of a plurality of gratings in the first periodic structure may have a first width along a first axis and a first height along a second axis. The first periodic structure may have a first pitch. The target may further comprise a second periodic structure formed on a second layer of the semiconductor device. Each of a plurality of gratings in the second periodic structure may have a second width along the first axis and a second height along the second axis. The second width may be narrower than the first width. The second periodic structure may have a second pitch less than the first pitch. The gratings of the first periodic structure may be positioned to overlap with the gratings of the second periodic structure. The first periodic structure and the second periodic structure may provide electron beam overlay measurements and scatterometry overlay measurements.

According to an embodiment of the present disclosure, the first height may be longer than the second height. The second periodic structure may be configured in two arrays. The gratings of the first periodic structure may extend over each of the arrays of the second periodic structure along the second axis.

According to an embodiment of the present disclosure, the second periodic structure may extend beyond the first periodic structure along the first axis.

According to an embodiment of the present disclosure, the first periodic structure and the second periodic structure may be in a first array. The target may further comprise a second array of the first periodic structure and a second of the second periodic structure. The second periodic structure in the second array may extend beyond the first periodic structure in a direction along the second axis from that of the first array.

According to an embodiment of the present disclosure, the target may further comprise a third array of the first periodic structure and a third and fourth array of the second periodic structure. The first height may be longer than the second height, and the gratings of the first periodic structure in the third array may extend over the third and fourth arrays of the second periodic structure along the second axis.

According to an embodiment of the present disclosure, four arrays of the first periodic structure and the second periodic structure may be disposed such that two of the four arrays are oriented perpendicular to another two of the four arrays. The second periodic structure may extend beyond the first periodic structure along the second axis. Each of the gratings in the first periodic structures may define a gap along the second axis. The second periodic structure may be exposed through the gap, and the first periodic structure extends beyond the second periodic structure along the second axis.

Another embodiment of the present disclosure may provide a target. The target may comprise a first periodic structure formed on a first layer of a semiconductor device. Each of a plurality of gratings in the first periodic structure may have a first width along a first axis and a first height along a second axis, and the first periodic structure have a first pitch. The target may further comprise a second periodic structure formed on a second layer of the semiconductor device. Each of a plurality of gratings in the second periodic structure may have a second width and a second height. The second width may be equal to the first width. The second periodic structure may have a second pitch equal to the first pitch, and the gratings of the first periodic structure are disposed between the gratings of the second periodic structure. The first periodic structure and the second periodic structure may provide electron beam overlay measurements and scatterometry overlay measurements.

According to an embodiment of the present disclosure, four arrays of the first periodic structure and the second periodic structure may be disposed such that two of the four arrays are oriented perpendicular to another two of the four arrays.

According to an embodiment of the present disclosure, the second periodic structure may extend beyond the first periodic structure along the second axis at a side of each of the arrays, and the first periodic structure may extend beyond the second periodic structure along the second axis at an opposite side of each of the arrays.

According to an embodiment of the present disclosure, each of the gratings in the first periodic structures may define a gap along the second axis. The second periodic structure may extend beyond the first periodic structure in the gap along the second axis in each of the arrays.

Another embodiment of the present disclosure provides a method. The method may comprise providing a target. The target may include a first periodic structure formed on a first layer of a semiconductor device. Each of a plurality of gratings in the first periodic structure may have a first width along a first axis and a first height along a second axis, and the first periodic structure may have a first pitch. The target may also include a second periodic structure formed on a second layer of the semiconductor device. Each of a plurality of gratings in the second periodic structure may have a second width and a second height.

The method may further comprise performing electron beam overlay measurements and scatterometry overlay measurements on the target using at least one semiconductor metrology tool.

According to an embodiment of the present disclosure, the second width may be narrower than the first width. The second periodic structure may have a second pitch less than the first pitch, and the gratings of the first periodic structure are positioned over the gratings of the second periodic structure.

According to an embodiment of the present disclosure, the first height may be longer than the second height. The second periodic structure may be configured in two arrays, and the gratings of the first periodic structure may extend over each of the arrays of the second periodic structure along the second axis.

According to an embodiment of the present disclosure, the first periodic structure and the second periodic structure may be in a first array. The target may further comprising a second array of the first periodic structure and a second of the second periodic structure. The second periodic structure in the second array may extend beyond the first periodic structure in a direction along the second axis from that of the first array According to an embodiment of the present disclosure, the second periodic structure may extend beyond the first periodic structure along the first axis and the second axis.

According to an embodiment of the present disclosure, four arrays of the first periodic structure and the second periodic structure may be disposed such that two of the four arrays are oriented perpendicular to another two of the four arrays.

According to an embodiment of the present disclosure, the second periodic structure may extend beyond the first periodic structure along the second axis at a side of each of the arrays, and the first periodic structure may extend beyond the second periodic structure along the second axis at an opposite side of each of the arrays.

According to an embodiment of the present disclosure, each of the gratings in the first periodic structures may define a gap along the second axis, and the first periodic structure may extend beyond the second periodic structure along the second axis in each of the arrays.

According to an embodiment of the present disclosure, the second width may be equal to the first width, and the second periodic structure may have a second pitch equal to the first pitch. The gratings of the first periodic structure may be positioned between the gratings of the second periodic structure.

According to an embodiment of the present disclosure, four arrays of the first periodic structure and the second periodic structure may be disposed such that two of the four arrays are oriented perpendicular to another two of the four arrays.

According to an embodiment of the present disclosure, the second periodic structure may extend beyond the first periodic structure along the second axis at a side of each of the arrays, and the first periodic structure may extend beyond the second periodic structure along the second axis at an opposite side of each of the arrays.

According to an embodiment of the present disclosure, each of the gratings in the first periodic structures may define a gap along the second axis, and the second periodic structure may extend beyond the first periodic structure in the gap along the second axis in each of the arrays.

Another embodiment of the present disclosure provides a semiconductor metrology tool. The semiconductor metrology tool may be configured to perform the overlay measurements on any of the targets of the present disclosure.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

In general, an overlay error between two process layers or a shift between two sets of structures on the same layer may be determined using overlay targets, for which the target structures are designed with a known relationship between their symmetry characteristics and discrepancies from such symmetry correspond to overlay error in such targets. As used herein, a layer may refer to any suitable materials, such as a semiconductor or a photoresist layer that are generated and patterned for fabrication of a wafer device or test structure. Although the following target examples are shown to have structures on two (or more) layers for measuring overlay, each target may include two (or more) sets of structures on the same layer for determining a shift error between such set of structures. Additionally, embodiments of the present disclosure may be applied to any type of periodic targets, and such targets may be formed in an inactive area (e.g., scribe line) or in an active region of a die on of a production wafer (e.g., as part of a device portion of a die). Techniques that are described herein may also be applied to targets for determining other types of characteristics, such as critical dimension (CD), CD uniformity (CDU), edge placement error (EPE), pattern fidelity, etc.

Overlay targets typically occupy an expensive location on an integrated circuit. Semiconductor manufacturers generally seek to decrease measurement time and wafer area of these overlay targets. Space on a wafer can be saved, measurement time can be made faster, and a comparison of results from the two technologies can be performed by combining imaging-based and scatterometry-based targets. Thus, including two targets in an area of an integrated circuit and measuring both overlay targets at the same time would provide benefits to the semiconductor manufacturing process.

Figure 5:
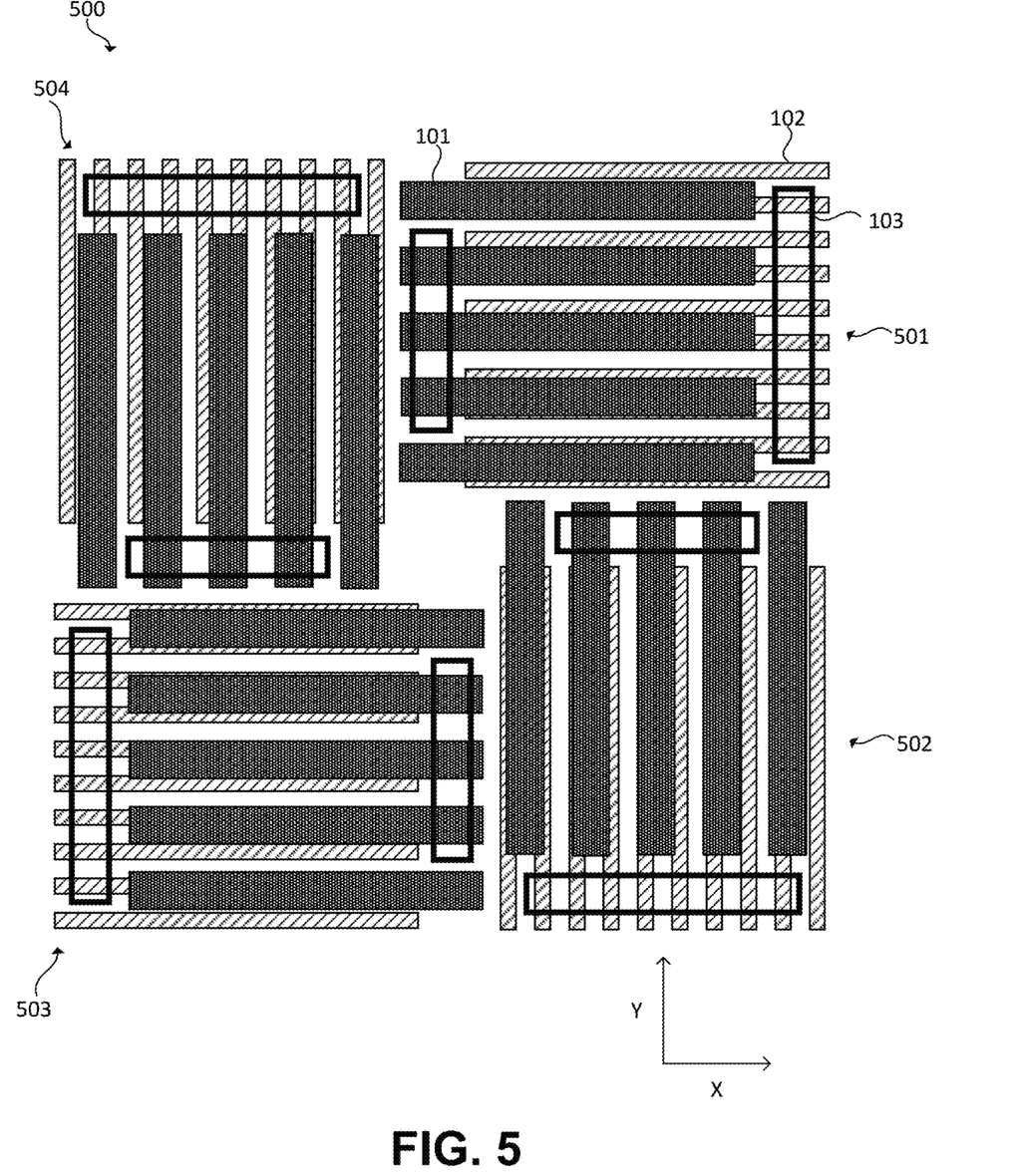
FIG. 5 is another combined electron beam overlay and scatterometry overlay target.

Embodiments disclosed herein combine electron beam overlay (eOVL) with scatterometry overlay (SCOL). Currently the scanning electron microscope (SEM) technology is used as a ruler for optical metrology measurements. Embodiments disclosed herein provide solutions with new target designs for electron beam overlay for combination with optical measurements. Target architypes also can combine optical image-based overlay (IBO) and diffraction-based overlay (DBO) targets (as shown in FIG. 5) with electron beam overlay specialized targets. Alternating the combined targets can enable denser sampling to increase model accuracy because the number of measurement samples on the wafer increases while keeping the wafer real estate identical. The mixed targets use 100% real estate available for overlay metrology, which provides a 2× increased number of targets for both technologies.

Target designs disclosed herein can reduce measurement move-acquire-measurement (MAM) time and improve measurements accuracy because the regions of interest (ROI) can contain both X and Y information content within small field of view (FOV). For example, in one ROI, one grating may be for information in the X direction, and another grating may be for information in the Y direction. It may not be necessary to move to two different targets because all the information is contained in one target. Thus, the disclosed targets increase the information content per area.

The measurements can be applied on coarse and fine pitch of the different target architypes. The target stack materials can vary between line and space features. The reverse combination use case can use the current optical targets with a denser sampling of electron beam overlay targets. A combined design of four cell scatterometry overlay and electron beam overlay also can be used.

The embodiments disclosed herein can enable scatterometry target axis separation, which contains two cells per direction as in standard four cell design with prolonged bars in both directions of each layer per cell. This can provide physical separation between the different alignment scheme layers. The region of interest placement on such target type can be separated for each layer. Since multiple region of interest used per direction targets architecture of bar over bar and bar over trench with induced overlay. This can be used for scatterometry target (f0) measurable regardless of their shift coverage (e.g., FIGS. 1-3). Both directions can be applicable within the same target as well with prolonged bars per axis (e.g., FIGS. 4-8).

Any design image-based overlay or diffraction-based overlay can enable an electron beam overlay target, center of electron beam overlay, and optical target that coincide. This can eliminate process variation effect, placement error effect, and can improve the ability to correct of the modeled terms. Due to design rules, the electron beam overlay target may be placed as close as possible to the optical target. To process very small semiconductor structures, special illumination conditions (e.g., annular, structured, etc.) may be used during the lithography step. These illumination conditions may be optimized for the specific process step and may be only good for certain pattern shapes (e.g., diagonal lines). The allowed pattern shapes for a specific process step may be defined by the so called "design rules." Patterns which violate the design rules (e.g., standard target designs) may suffer from processing problems. Being able to design targets which follow the design rules for the actual device patterns may be advantageous.

Additional segments can be added to the optical target to fill in the space occupied by electron beam overlay target placement or prolongation of the bars, which can enable more information content.

Figure 1:
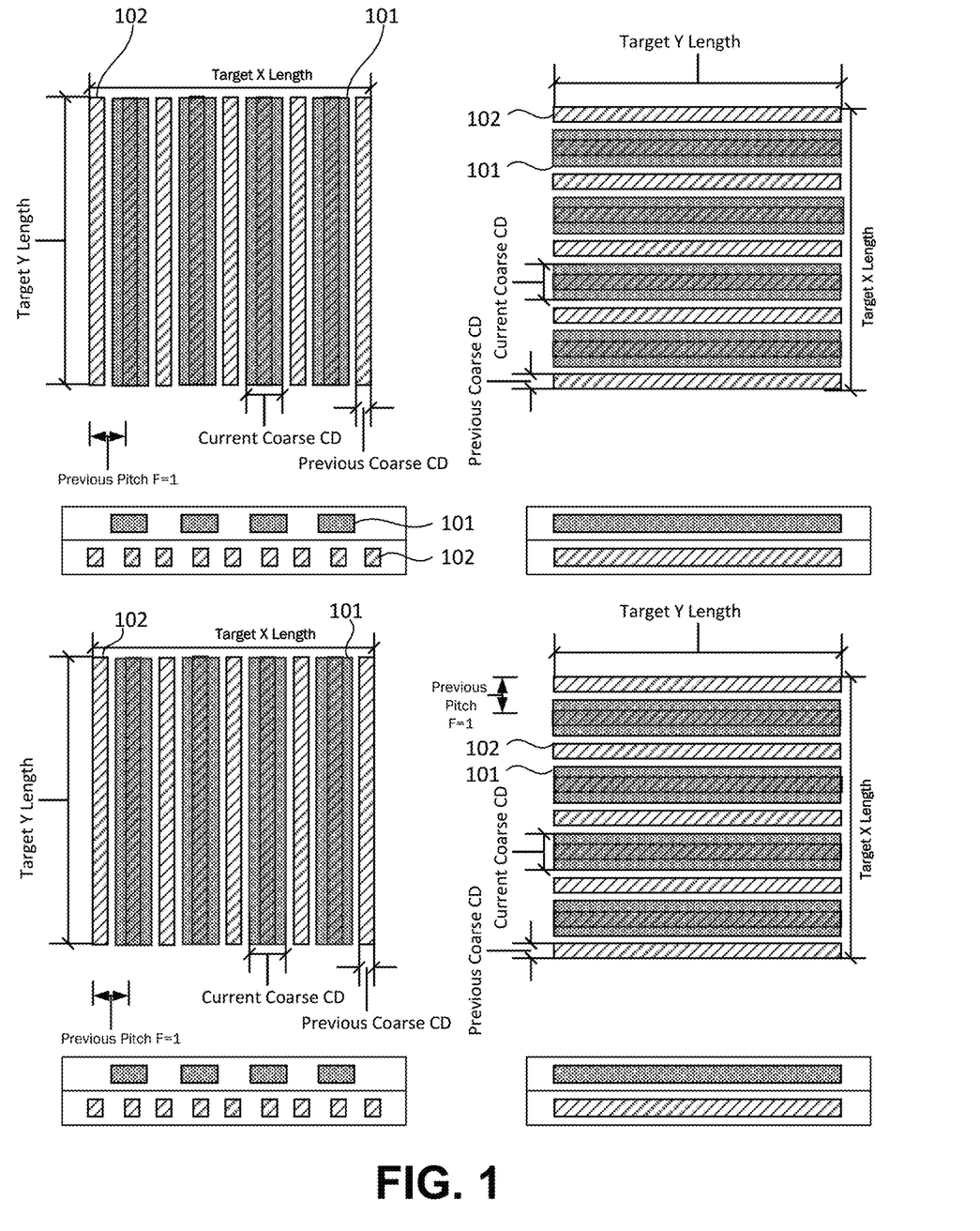
FIG. 1 is an exemplary scatterometry overlay target.

FIG. 1 is an exemplary scatterometry overlay target. The overlay target includes a first periodic structure 101 and a second periodic structure 102. These are shown with different shading for ease of illustration. The first periodic structure 101 is formed on a first layer of a semiconductor device and has a first pitch along an axis and the second periodic structure 102 is formed on a second layer of the semiconductor device and has a second pitch along that axis, different from the first pitch. Dummification structures may be used to fill empty areas (e.g., white areas in FIG. 1) of the target 100 (or other targets of the present disclosure) or to gradually change between large and small structures without interfering with target design. In FIG. 1, "previous" refers to the first layer, and "current" refers to the second layer. "CD" refers to the critical dimension, corresponding to the widths of the first periodic structure 101 and the second periodic structure 102. "Pitch" describes the distance between two adjacent structures in the first periodic structure 101 and the second periodic structure 102. When suitably illuminated, the first and second periodic structures 101, 102 together form a pattern. The layers can be adjacent to each other or can be separated by other layers. The first periodic structure 101 and second periodic structure 102 are illustrated as see-through for ease of illustration.

Corresponding cross-sectional side views of the first periodic structure 101 and a second periodic structure 102 in separate layers (e.g., a first layer and a second layer) is shown for each of the views of FIG. 1.

Figure 2:
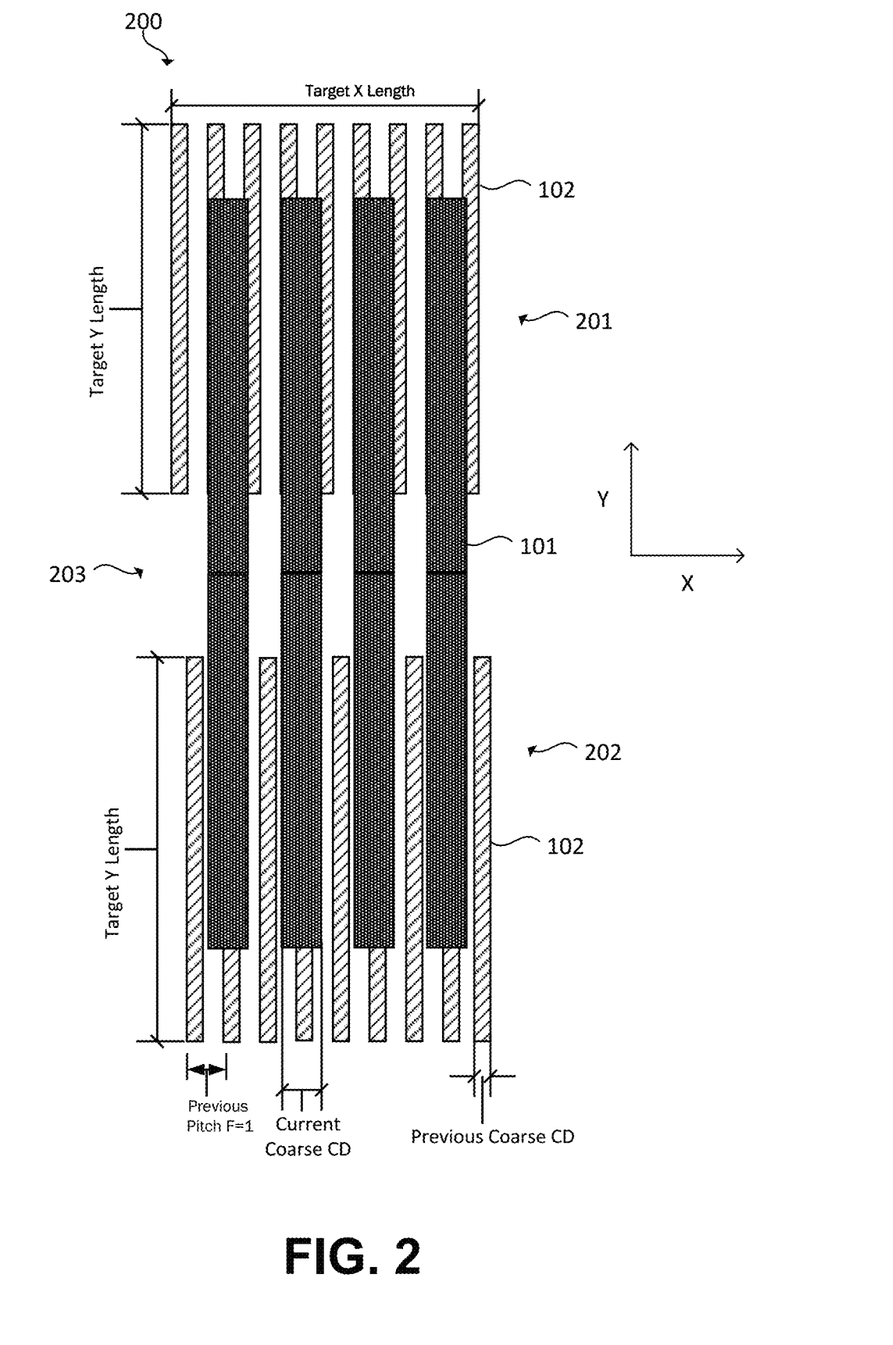
FIG. 2 is a combined electron beam overlay and scatterometry overlay target.

FIG. 2 is a combined electron beam overlay and scatterometry overlay target 200. The target 200 can be a combined electron beam overlay and scatterometry overlay target in one direction. For example, scatterometry uses the areas where layers of gratings overlap, while electron beam overlay uses the areas where layers of gratings are separated. The target 200 includes a first periodic structure 101 formed on a first layer of a semiconductor device. Each of a plurality of gratings in the first periodic structure 101 has a first width along a first axis (e.g., X) and a first height along a second axis (e.g., Y). The first width may be between 1 μm and 100 μm. The first height may be between 10 μm and 100 μm. The first width and the first height may be larger or smaller than the ranges above depending on the particular application.

The first periodic structure 101 has a first pitch. The first pitch may be between 200 nm and 1000 nm. The first pitch may also be smaller or larger than the range above depending on the particular application.

A second periodic structure 102 is formed on a second layer of the semiconductor device. Each of a plurality of gratings in the second periodic structure 102 has a second width along the first axis (e.g., X) and a second height along the second axis (e.g., Y). The second width of the second periodic structure 102 is narrower than the first width of the first periodic structure 101. The second width may be between 1 μm and 100 μm. The second height may be between 10 μm and 100 μm. The first width and the first height may be larger or smaller than the ranges above depending on the particular application. The second periodic structure 102 has a second pitch less than the first pitch of the first periodic structure 101. The second pitch may be between 200 nm and 1000 nm. The second pitch may also be smaller or larger than the range above depending on the particular application. The gratings of the first periodic structure 101 are positioned over the gratings of the second periodic structure 102.

The first and second periodic structures 101, 102 are mutually overlaid and are formed of arrays of mutually parallel lines on the first and second layers of the semiconductor device. The lines are arranged in registration along an axis, such as the Y-axis. The structure siszes, dimensions, and angles of fine segmentation may depend on the semiconductor manufacturer, technology node, and processing step. Notes may operate at structure sizes of a few nm to several μm. In the case of diagonal structures, 15° to 30° may be common, but other angles are possible.

Target 200 can have overall side lengths between 10 μm and 100 μm. For example, the overall side lengths may be not greater than 40 μm. In general, the size of the target 200 may depend on the selected optical wavelength and beam size. Larger targets may make measurements easier, but may also take up more area on the semiconductor wafer. Reducing the size of the target 100 may reduce cost of production and increase available space on the wafer. The particular balance of physics and costs to select a target size may depend on the design rules of the process of the specific layer and/or product. The target 200 can be rectangular in shape.

In the embodiment of FIG. 2, the first height of the first periodic structure 101 is longer than the second height of the second periodic structure 102. The second periodic structure 102 is arranged in two arrays 201, 202. The gratings of the first periodic structure 101 extend over each of the arrays 201, 202 of the second periodic structure 102 along the second axis.

The first periodic structure 101 can have a first height between 10 μm and 100 μm. The difference between the first height and the second height bay depend on the design rules of the particular application.

The target 200 can have an unpatterned zone 203 in the second layer of the semiconductor device between the ends of the two arrays 201, 202.

The first periodic structure 101 over the unpatterned zone 203 in the second layer can make it possible to readily detect the ends of the second periodic structure 102. This also can enable detection of a center of symmetry of the target 200.

The first and second layers of FIG. 2 or other embodiments described herein may be mutually adjacent but need not be, and may be separated by a height ranging from 100 nm to over 10 μm. The upper layer, here shown as first layer with the first periodic structure 101, is at least partially transparent to photons. It is further appreciated that while embodiments disclosed herein depict first periodic structure 101 arranged above second periodic structure 102, targets can be formed with second periodic structure 102 arranged above first periodic structure 101. The pitch of the first periodic structure 101 and the second periodic structure may be on the order of the wavelength of the optical system in order to be measurable by the optics. In this way, the pitch may range from 400 nm to 1000 nm and beyond, depending on the particular optical system. Design of the target further depend on the details of the wafer processing, which governs the allowable distance, pitch, height, etc.

Figure 3:
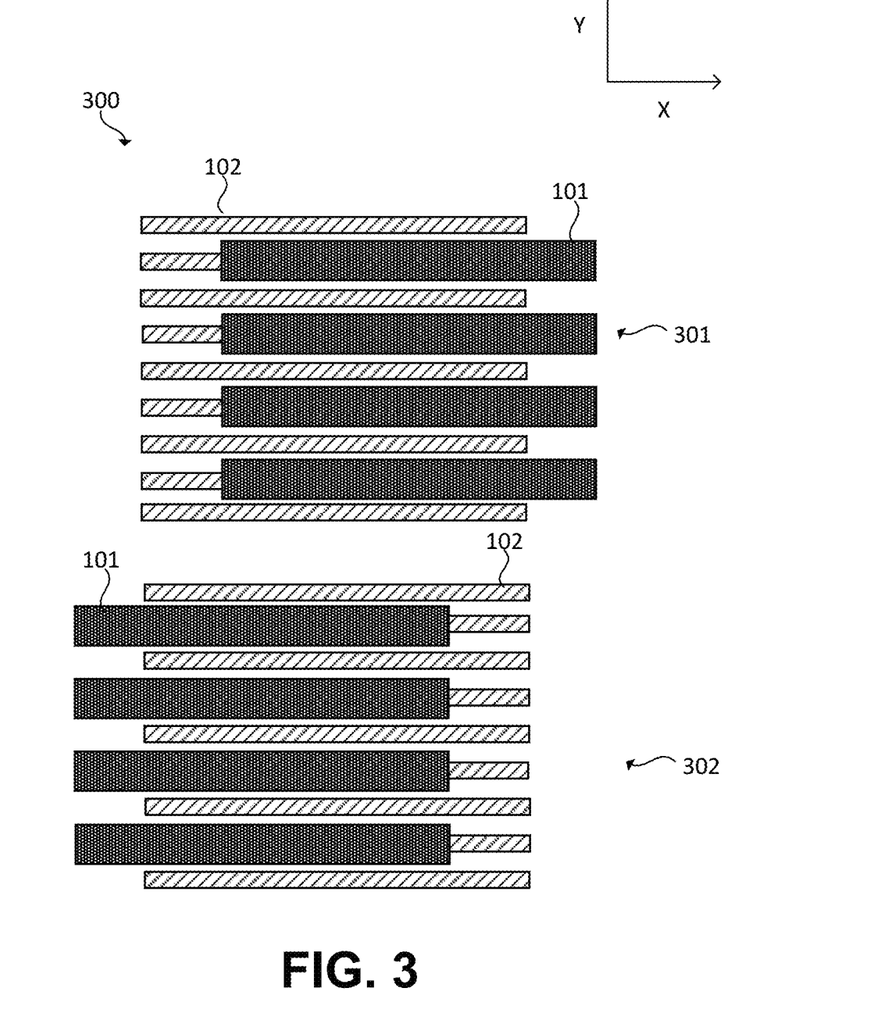
FIG. 3 is another combined electron beam overlay and scatterometry overlay target.

FIG. 3 is another combined electron beam overlay and scatterometry overlay target 300. The target 300 can be a combined electron beam overlay and scatterometry overlay target in one direction perpendicular to the direction shown in FIG. 2. In the target 300, the gratings of the second periodic structure 102 extend beyond the first periodic structure 101. The first periodic structure and the second periodic structure are both arranged in two arrays 301,302.

The first periodic structure 101 and second periodic structure 102 includes extended portions, which extend beyond the other periodic structure for approximately 500 nm to 2000 nm in opposite directions along that axis. The extended portions of the second periodic structure can make it possible to readily optically detect the ends of the first periodic structure 101 and the second periodic structure 102, and thus their centers of symmetry. The size of the target 300 and its structures may be similar to those of the target 200 described above.

Figure 4:
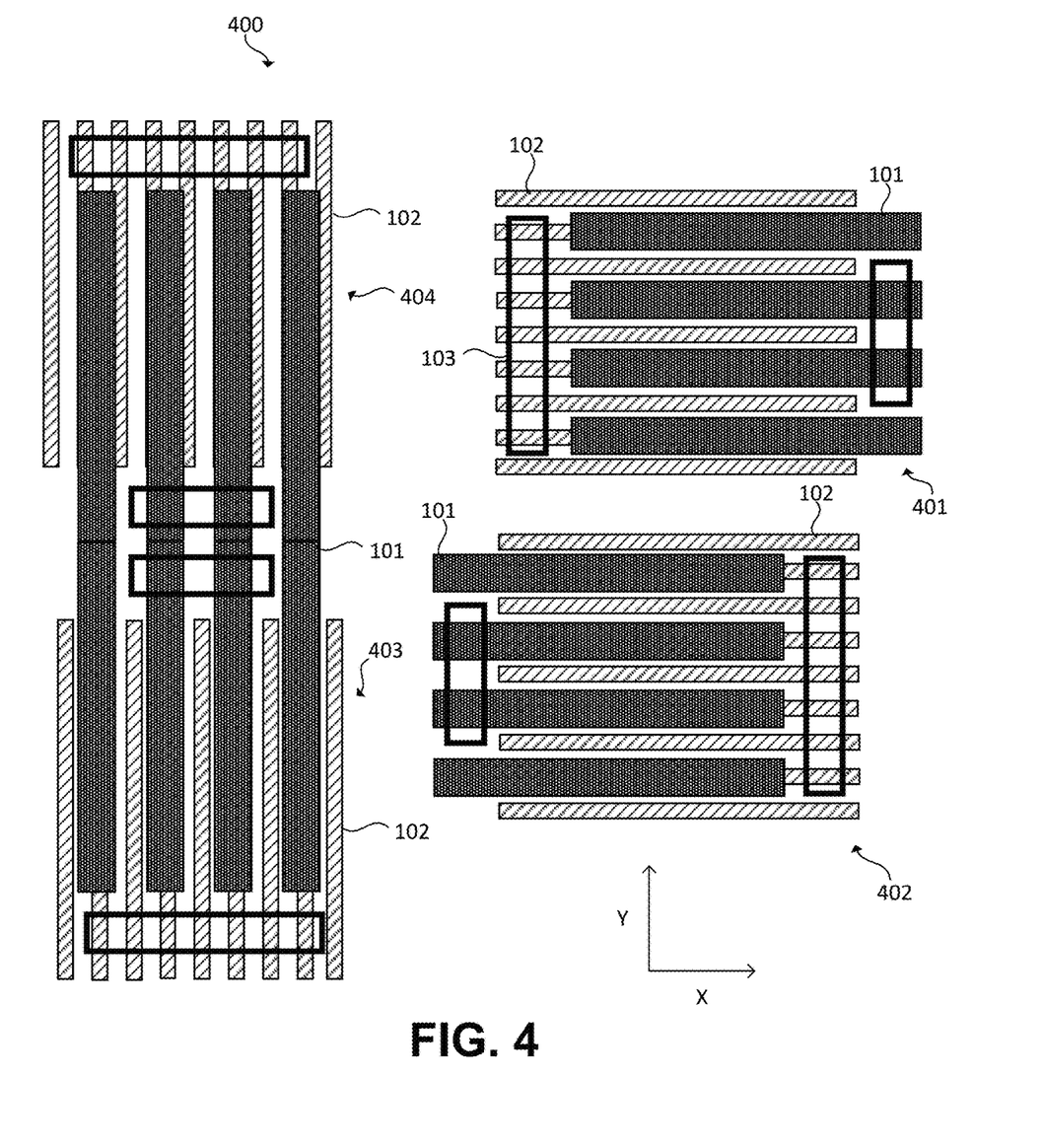
FIG. 4 is another combined electron beam overlay and scatterometry overlay target.

FIG. 4 is another combined electron beam overlay and scatterometry overlay target 400. The target 400 can be a combined electron beam overlay and scatterometry overlay target in two perpendicular directions. The second periodic structure 102 is in four arrays 401-404.

Like the targets 200 and 300, the gratings of the second periodic structure 102 extend beyond the first periodic structure 101 in the arrays 401-404. Like the target 200, the target 400 can have an unpatterned zone 203 in the second layer of the semiconductor device between the ends of the two arrays 201, 202. Thus, the second periodic structure 102 extends beyond the first periodic structure 101 along the first axis and perpendicular second axis.

The first height of the first periodic structure 101 between the third and fourth array 403, 404 is longer than the second height of the second periodic structures 102 in the third and fourth array 403, 404. The gratings in the first periodic structure 101 in the third array 403 extend over the third and fourth array 403, 404 of the second periodic structure 102 along the second axis. The size of the target 400 and its structures may be similar to those of the target 200 described above.

The target 400 also includes regions of interest 103 (represented by hollow black rectangles). The regions of interest 103 may be related to the setup of the image processing algorithm and the type of image processing algorithm used. Segments of the grating at the outer bars can be removed due to their higher sensitivity to aberration for parallel segmentations. The region of interest placement on the fine segmentation can exclude the extreme segments to improve aberration accuracy within a single bar.

FIG. 5 is another combined electron beam overlay and scatterometry overlay target 500. The target 500 can be a combined electron beam overlay and scatterometry overlay target. There are four arrays 501-504 of the first and second periodic structures 101, 102. Two of the arrays 501 and 503 are oriented perpendicular to the other two arrays 502, 504.

The second periodic structure 102 extends beyond the first periodic structure 102 along the first axis and perpendicular second axis. Thus, the outer edge of the arrays 501-504 is the gratings of the second periodic structure 102. The first periodic structure 101 extends beyond the second periodic structure 102 on the opposite side of the arrays 501-504, which may not be an outer edge.

The target 500 also includes regions of interest 103. The size of the target 500 and its structures may be similar to those of the target 200 described above.

Figure 6:
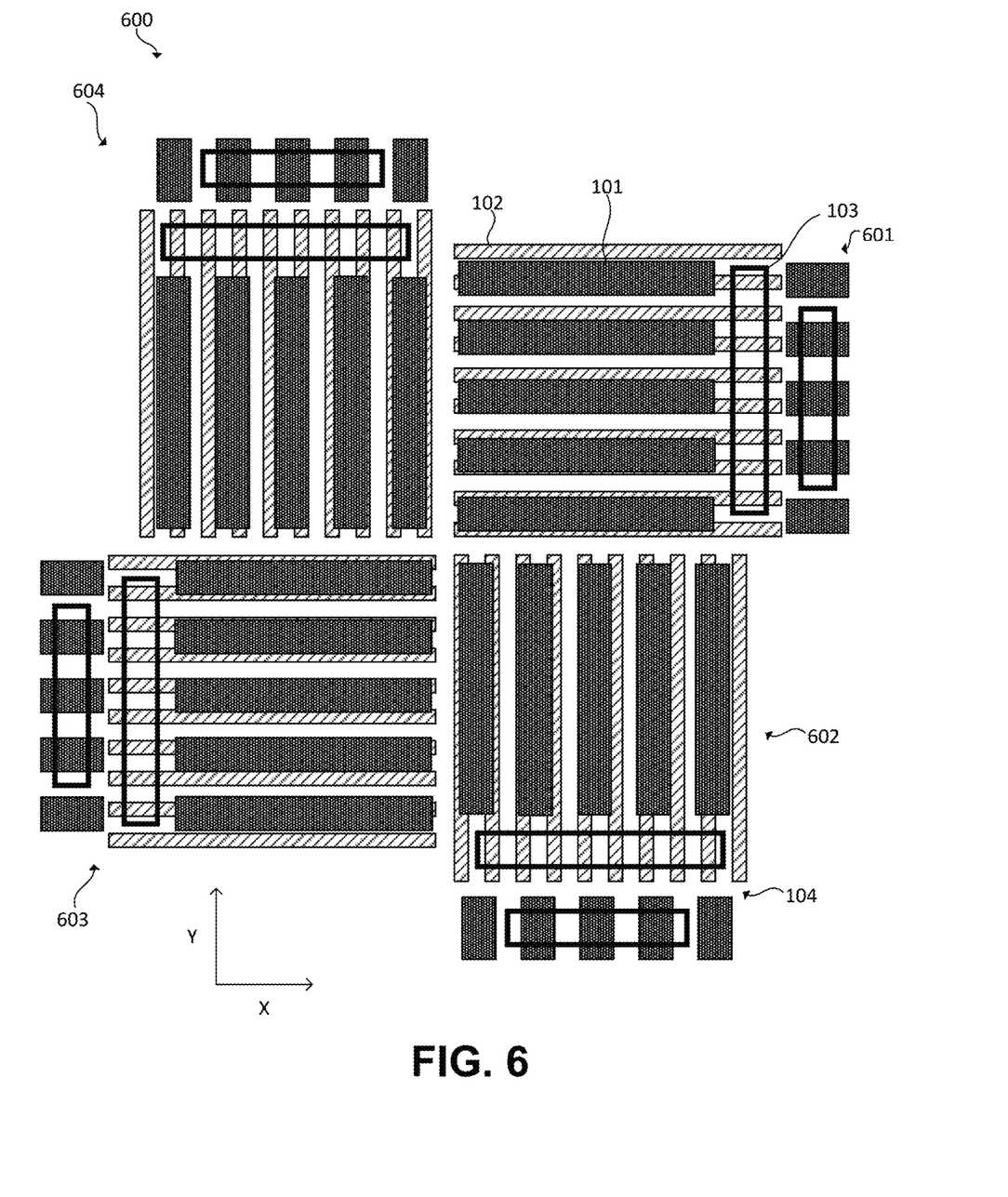
FIG. 6 is another combined electron beam overlay and scatterometry overlay target.

FIG. 6 is another combined electron beam overlay and scatterometry overlay target 600. The target 600 can be a combined electron beam overlay and scatterometry overlay target. There are four arrays 601-604 of the first and second periodic structures 101, 102. Two of the arrays 601 and 603 are oriented perpendicular to the other two arrays 602, 604.

Each of the gratings in the first periodic structures 101 define a gap 104 along the axes. The second periodic structure 102 is exposed through the gaps 104. The first periodic structure 101 extends beyond the second periodic structure 102 along the axes.

The target 600 also includes regions of interest 103. The size of the target 600 and its structures may be similar to those of the target 200 described above.

Figure 7:
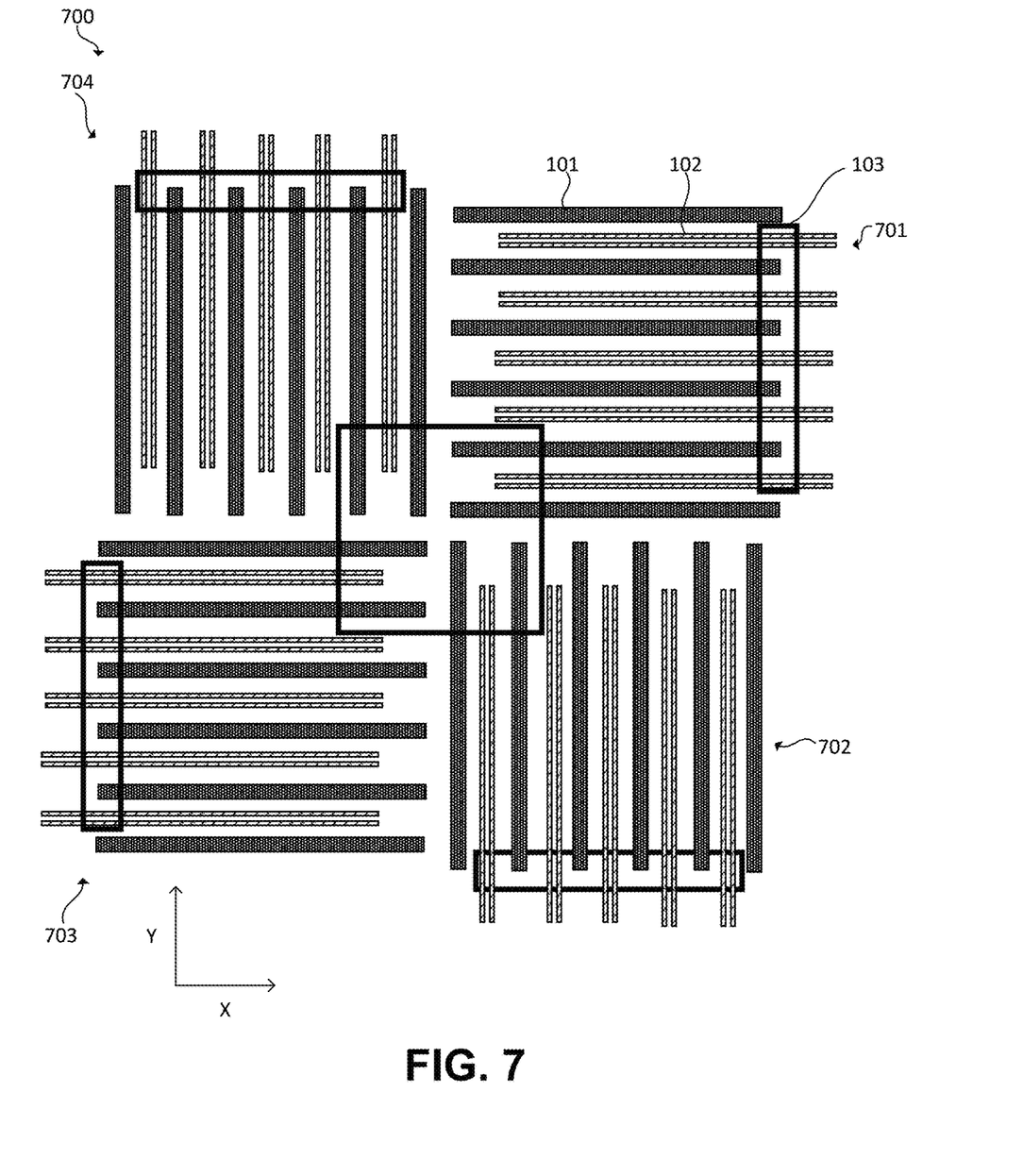
FIG. 7 is a combined electron beam overlay and scatterometry overlay target with a region of interest in the center.

FIG. 7 is a combined electron beam overlay and scatterometry overlay target 700 with a region of interest in the center. The target 700 can be a combined electron beam overlay and scatterometry overlay target. The target 700 includes a first periodic structure 101 formed on a first layer of the semiconductor device. Each of the gratings in the first periodic structure 101 has a first width along a first axis (e.g., X or Y) and a first height along a second axis that is perpendicular to the first axis. The first periodic structure 101 has a first pitch.

The second periodic structure 102 is formed on a second layer of the semiconductor device. Each of the gratings in the second periodic structure 102 has a second width and a second height. The second width may be the same as the first width. The second height may be the same as the first height. The second periodic structure 102 can have a second pitch, which may be equal to the first pitch.

The second periodic structure 102 can include two gratings within the width of one grating of the first periodic structure 101. There can be a gap between these two gratings. Including a gap between gratings can improve the compatibility of the target with the wafer process parameters. For example, if the current processing step requires gaps for device structures, creating targets which mimic those gaps can be favorable.

Gratings of the second periodic structure 102 are disposed between the gratings of the first periodic structure 101.

There are four arrays 701-704 of the first and second periodic structures 101,102. Two of the arrays 701 and 703 are oriented perpendicular to the other two arrays 702,704.

The second periodic structure 102 extends beyond the first periodic structure 101 along an axis of each of the arrays 701-704. The first periodic structure 101 extends beyond the second periodic structure 102 along the axis at an opposite side of each of the arrays.

The target 700 also includes regions of interest 103. The size of the target 700 and its structures may be similar to those of the target 200 described above.

Figure 8:
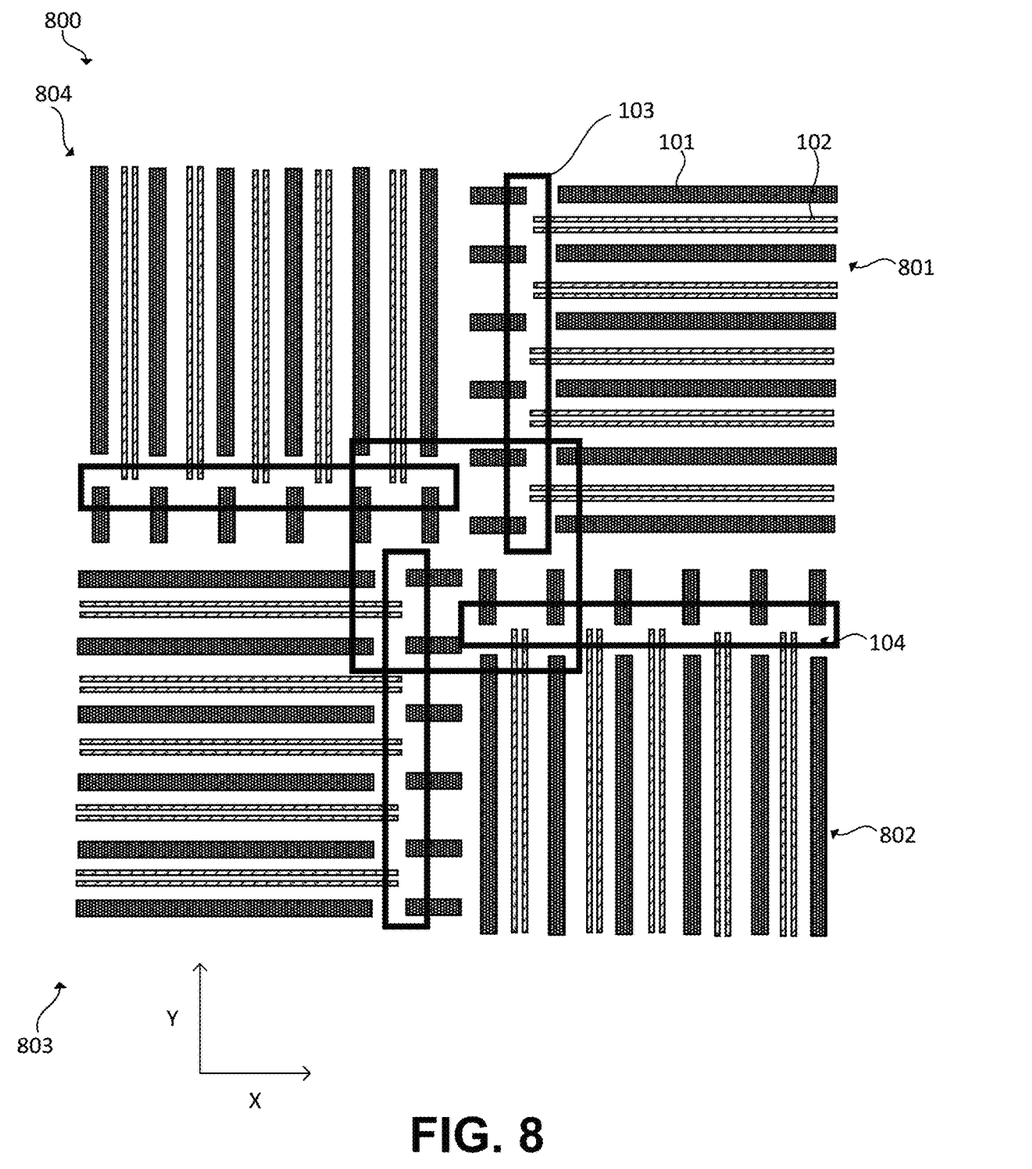
FIG. 8 is another combined electron beam overlay and scatterometry overlay target with a region of interest in the center.

FIG. 8 is another combined electron beam overlay and scatterometry overlay target 800 with a region of interest in the center. The target 800 can be a combined electron beam overlay and scatterometry overlay target. The target 800 has arrays 801-804. The first periodic structure 101 defines a gap

104 along the axis of each of the array 801-804. The second periodic structure 102 extends beyond the first periodic structure 101 along the axis into the gap 104.

The target 800 also includes regions of interest 103. The size of the target 800 and its structures may be similar to those of the target 200 described above.

Figure 9:
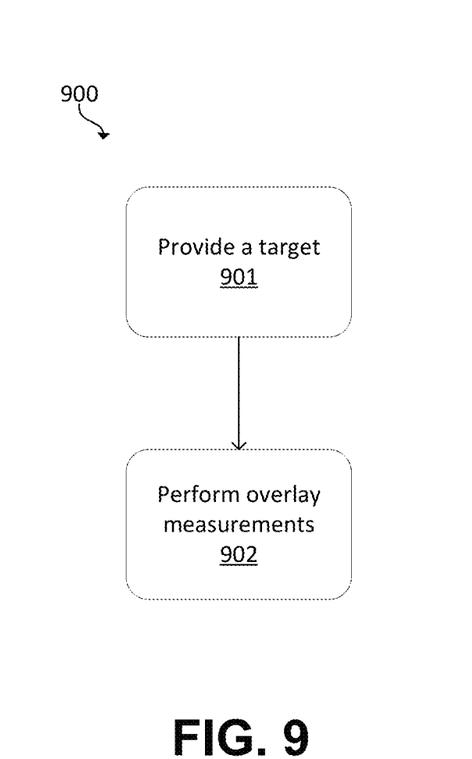
FIG. 9 is a flowchart of a method in accordance with the present disclosure.

FIG. 9 is a flowchart of a method 900. In the method, a target is provided at 901. The target can be one of the targets disclosed herein. Overlay measurements are performed at 902 using a semiconductor metrology tool. The semiconductor metrology tool may be a conventional tool, which utilizes conventional processing algorithms, or may be an electron beam tool, which uses different measurement techniques. For example, one beam spot can be applied to a grating. A single reflectivity value is collected per grating. Each cell will contain an induced offset to calculate overlay. At least four cells with different induced offsets may be used. This method can be propagated until "n" cells occur. A beam spot can be scanned to average spot position accuracy.

Figure 10:
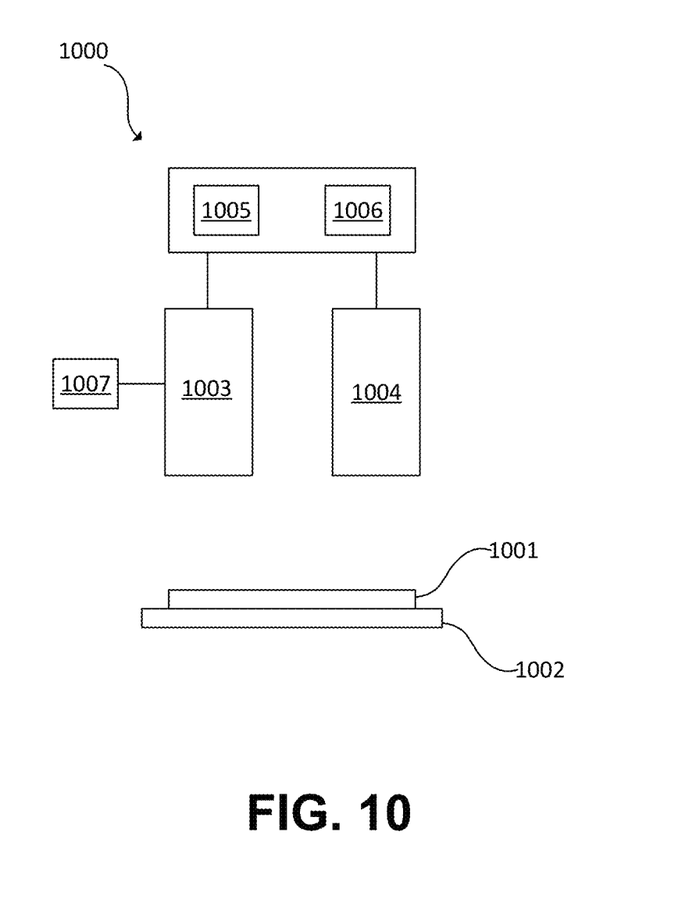
FIG. 10 is a diagram of a system in accordance with the present disclosure.

FIG. 10 is a diagram of a system 1000. The system 1000 includes a chuck 1002 configured to hold a wafer 1001. The wafer 1001 includes one or more overlay targets, such as those described in the embodiments herein.

The system 1000 includes an imaging optical system 1003 configured to measure the overlay target on the chuck 1002. The imaging optical system 1003 can include an illumination source oriented to direct radiation onto a specific location of the wafer 1001 and one or more detectors oriented to detect an optical signal which from the wafer 1001. The illumination source in the optical system 1003 can generate an illumination beam directed at the wafer 1001. The imaging optical system 1003 also can include various lenses, optical components, other steering devices, or other beam transport devices. The illumination beam can be an optical beam or an electron beam.

The imaging optical system 1003 can be used for acquisition such that the imaging optical system 1003 is part of the acquisition sequence of the scatterometry measurement.

The system 1000 includes a scatterometry system 1004 configured to measure the overlay target on the chuck 1002. The scatterometry system 1004 can be configured to measure the same overlay target as the imaging optical system 1003.

The scatterometry system 1004 can include an illumination source oriented to direct radiation onto a specified location of the wafer 1001 and one or more detectors oriented to detect a scatterometry signal which has been scattered by the wafer 1001. The illumination source in the scatterometry system 1004 can generate an illumination beam directed at the wafer 1001. The scatterometry system 1004 also can include various lenses or optical components. The scatterometry system 1004 can use the imaging optical system 1003 or information from the imaging optical system 1003 during the scatterometry sequence.

Measurements of the wafer 1001 by the imaging optical system 1003 and the scatterometry system 1004 can be performed while the wafer 1001 remains on the chuck 1002. Thus, the wafer 1001 may not move between measurement by the imaging optical system 1003 and the scatterometry system 1004. In an instance, a vacuum around the wafer 1001 is not broken between measurements by the imaging optical system 1003 and the scatterometry system 1004. In an instance, one of the measurements by the imaging optical system 1003 and the scatterometry system 1004 occurs after the other. In another instance, the measurements by the imaging optical system 1003 and the scatterometry system 1004 occur at least partially simultaneously or at the same time.

While disclosed as one system 1000, the imaging optical system 1003 and the scatterometry system 1004 can be in two separate systems. Each of the systems may have a separate chuck.

A processor 1005 is in electronic communication with an electronic data storage unit 1006, the imaging optical system 1003, and the scatterometry system 1004. The processor 1005 may include a microprocessor, a microcontroller, or other devices. The processor 1005 can receive output from the imaging optical system 1003 and the scatterometry system 1004.

The system 1000 can include an imaging optical system acquisition module 1007 configured to acquire the overlay target on the chuck 1002 with the imaging optical system 1003. The optical system acquisition module 1007 forms an acquisition image that can be used by the imaging optical system 1003 or the scatterometry system 1004. While illustrated as separate units, the imaging optical system acquisition module 1007 may be part of the imaging optical system 1003. The imaging optical system acquisition module 1007 also may be part of the processor 1005.

The processor 1005 and electronic data storage unit 1006 may be part of the system 1000 or another device. In an example, the processor 1005 and electronic data storage unit 1006 may be part of a standalone control unit or in a centralized quality control unit. Multiple processors 1005 or electronic data storage unit 1006 may be used. In an embodiment, the processor 1005 may be disposed in the system 1000.

The processor 1005 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 1005 to implement various methods and functions may be stored in readable storage media, such as a memory in the electronic data storage unit 1006 or other memory.

The processor 1005 may be coupled to the components of the system 1000 in any suitable manner (e.g., via one or more transmission media, which may include wired and/or wireless transmission media) such that the processor 1005 can receive output. The processor 1005 may be configured to perform a number of functions using the output.

The processor 1005, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 1005 may be configured to perform a number of functions using the output of the imaging optical system 1003, and the scatterometry system 1004, or other output. For instance, the processor 1005 may be configured to send measurement results of the wafer 1001. In another example, the processor 1005 can determine electron beam overlay and/or scatterometry overlay error within the target. In another example, the processor 1005 may be configured to send the output to an electronic data storage unit 1006 or another storage medium. The processor 1005 may be further configured as described herein.

The processor 1005 may be configured according to any of the embodiments described herein. The processor 1005 also may be configured to perform other functions or additional steps using the output of the system 1000 or using images or data from other sources.

In another embodiment, the processor 1005 may be communicatively coupled to any of the various components or sub-systems of system 1000 in any manner known in the art. Moreover, the processor 1005 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 1005 and other subsystems of the system 1000 or systems external to system 1000.

In some embodiments, various steps, functions, and/or operations of system 1000 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 1005 (or computer system) or, alternatively, multiple processors 1005 (or multiple computer systems). Moreover, different sub-systems of the system 1000 may include one or more computing or logic systems. Therefore, the above description should not be interpreted as a limitation on the present disclosure but merely an illustration.

An additional embodiment relates to a non-transitory computer-readable medium storing program instructions executable on a processor for inspecting a wafer, as disclosed herein. In particular, a processor, such as the processor 1005, can be coupled to a memory in an electronic data storage medium, such as the electronic data storage unit 1006, with non-transitory computer-readable medium that includes executable program instructions. The computer-implemented method may include any step(s) of any method(s) described herein. For example, processor 1005 may be programmed to perform some or all of the steps of FIG. 9. The memory in the electronic data storage unit 1006 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In another embodiment, a method of designing of the targets disclosed herein can be used. The method may be performed with a processor, such as those described therein. The gratings of the first and second periodic structures of the targets disclosed herein can be optimized.

While specific configurations are shown in the embodiments illustrated herein, variations that include all or some of the features of these embodiments are possible.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A target comprising:
a first periodic structure formed on a first layer of a semiconductor device, wherein each of a plurality of gratings in the first periodic structure has a first width along a first axis and a first height along a second axis, wherein the first periodic structure has a first pitch;
a second periodic structure formed on a second layer of the semiconductor device, wherein each of a plurality of gratings in the second periodic structure has a second width along the first axis and a second height along the second axis, wherein the second width is narrower than the first width, wherein the second periodic structure has a second pitch less than the first pitch, and wherein the gratings of the first periodic structure are positioned to overlap with the gratings of the second periodic structure, wherein the second periodic structure extends beyond the first periodic structure along the first axis, and wherein the first periodic structure and the second periodic structure are in a first array;
a second array of the first periodic structure and a second of the second periodic structure, wherein the second periodic structure in the second array extends beyond the first periodic structure in a direction along the second axis from that of the first array; and
a third array of the first periodic structure and a third and fourth array of the second periodic structure, wherein the first height is longer than the second height, and wherein the gratings of the first periodic structure in the third array extend over the third and fourth arrays of the second periodic structure along the second axis;
wherein the first periodic structure and the second periodic structure provide electron beam overlay measurements and scatterometry overlay measurements.

2. The target of claim 1, wherein the second periodic structure is configured in two arrays, and wherein the gratings of the first periodic structure extend over each of the arrays of the second periodic structure along the second axis.

3. The target of claim 1, wherein four arrays of the first periodic structure and the second periodic structure are disposed such that two of the four arrays are oriented perpendicular to another two of the four arrays.

4. The target of claim 3, wherein the second periodic structure extends beyond the first periodic structure along the second axis.

5. The target of claim 3, wherein each of the gratings in the first periodic structures defines a gap along the second axis, wherein the second periodic structure is exposed through the gap, and wherein the first periodic structure extends beyond the second periodic structure along the second axis.

6. A target comprising:
   a first periodic structure formed on a first layer of a semiconductor device, wherein each of a plurality of gratings in the first periodic structure has a first width along a first axis and a first height along a second axis, wherein the first periodic structure has a first pitch; and
   a second periodic structure formed on a second layer of the semiconductor device, wherein each of a plurality of gratings in the second periodic structure has a second width and a second height, wherein the second width is equal to the first width, wherein the second periodic structure has a second pitch equal to the first pitch, and wherein the gratings of the first periodic structure are disposed between the gratings of the second periodic structure;
   wherein the first periodic structure and the second periodic structure provide electron beam overlay measurements and scatterometry overlay measurements.

7. The target of claim 6, wherein four arrays of the first periodic structure and the second periodic structure are disposed such that two of the four arrays are oriented perpendicular to another two of the four arrays.

8. The target of claim 7, wherein the second periodic structure extends beyond the first periodic structure along the second axis at a side of each of the arrays, and wherein the first periodic structure extends beyond the second periodic structure along the second axis at an opposite side of each of the arrays.

9. The target of claim 7, wherein each of the gratings in the first periodic structures defines a gap along the second axis, and wherein the second periodic structure extends beyond the first periodic structure in the gap along the second axis in each of the arrays.

10. A method comprising:
    providing a target including:
      a first periodic structure formed on a first layer of a semiconductor device, wherein each of a plurality of gratings in the first periodic structure has a first width along a first axis and a first height along a second axis, wherein the first periodic structure has a first pitch; and
      a second periodic structure formed on a second layer of the semiconductor device, wherein each of a plurality of gratings in the second periodic structure has a second width and a second height, wherein the second width is equal to the first width, wherein the second periodic structure has a second pitch equal to the first pitch, and wherein the gratings of the first periodic structure are positioned between the gratings of the second periodic structure; and
    performing electron beam overlay measurements and scatterometry overlay measurements on the target using at least one semiconductor metrology tool.

11. The method of claim 10, wherein four arrays of the first periodic structure and the second periodic structure are disposed such that two of the four arrays are oriented perpendicular to another two of the four arrays, and wherein one of:
    the second periodic structure extends beyond the first periodic structure along the second axis at a side of each of the arrays, and wherein the first periodic structure extends beyond the second periodic structure along the second axis at an opposite side of each of the arrays; or
    each of the gratings in the first periodic structures defines a gap along the second axis, and wherein the second periodic structure extends beyond the first periodic structure in the gap along the second axis in each of the arrays.

12. A semiconductor metrology tool configured to perform the overlay measurements on the target of the method of claim 10.

* * * * *